United States Patent

Mulkey et al.

[15] 3,665,458

[45] May 23, 1972

[54] CAPACITOR LADDER NETWORK

[72] Inventors: Owen R. Mulkey; Charles A. Kleingartner; Arnold A. Zoutte, all of Seattle, Wash.

[73] Assignee: The Boeing Company, Seattle, Wash.

[22] Filed: May 14, 1970

[21] Appl. No.: 37,081

[52] U.S. Cl. ....................340/347 DA

[51] Int. Cl. ....................H03k 13/02

[58] Field of Search ....................340/347 DA

[56] References Cited

UNITED STATES PATENTS

| | | | |
|---|---|---|---|
| 2,718,634 | 9/1955 | Hansen | 340/347 |
| 3,056,085 | 9/1962 | James | 340/347 |
| 2,889,549 | 6/1959 | Caughey | 340/347 |
| 3,325,802 | 6/1967 | Bacon | 340/347 |
| 3,307,173 | 2/1967 | Popodi | 340/347 |
| 3,504,360 | 3/1970 | Vosbury | 340/347 |

*Primary Examiner*—Thomas A. Robinson
*Assistant Examiner*—Jeremiah Glassman
*Attorney*—Kenneth W. Thomas, Glenn Orlob and Conrad O. Gardner

[57] ABSTRACT

A high speed digital to analog converter which utilizes capacitors. A capacitor ladder network in combination with switching means for selectively excluding individual ones of the capacitors from the network depending upon the parallel binary input signal information present is determinative of the analog output signal of the converter.

11 Claims, 2 Drawing Figures

INVENTORS,
CHARLES A. KLEINGARTNER
OWEN R. MULKEY
ARNOLD A. ZOUTTE
BY
Conrad O. Gardner
ATTORNEY

CAPACITOR LADDER NETWORK

This invention relates to digital to analog or analog to digital converters. More particularly, it relates to high speed, low cost digital to analog converters utilizing ladder networks.

In practice, digital to analog converters of the ladder type utilizing resistor networks have found widespread use. However, in such resistor ladder type networks made with a number of sections (N) necessary to obtain a conversion accuracy of one part in $2^N$, the resistors in a typical case must be matched or trimmed approximately to one part in $10 \times 2^N$ to assure the desired accuracy. This matching or trimming requires the use of costly parts and/or lengthy and costly trim times. A further disadvantage of such a resistor ladder network is that the maximum speed thereof is limited by the time constant of the resistors and their associated distributed and parisitic capacitances. A typical resistor d/a (digital to analog) converter of known type is shown in FIG. 9 on page 55 of Electronic Design 22, Oct. 24, 1968, published by Hayden Publishing Company, Inc., New York, N. Y.

It is, accordingly, the object of the present invention to provide an improvement in speed characteristics in d/a converters at a reduction in component costs utilizing state-of-the-art component manufacturing technology.

In accordance with an embodiment of the present invention, a ladder switching network utilizing capacitors and having scale factors inverted which is a dual of the aforementioned resistor ladder type network permits fabrication techniques using present thin film technology to achieve the above-mentioned objects.

Other objects of this invention will become apparent from the following description when taken in conjunction with the accompanying drawings in which.

Figure 2:
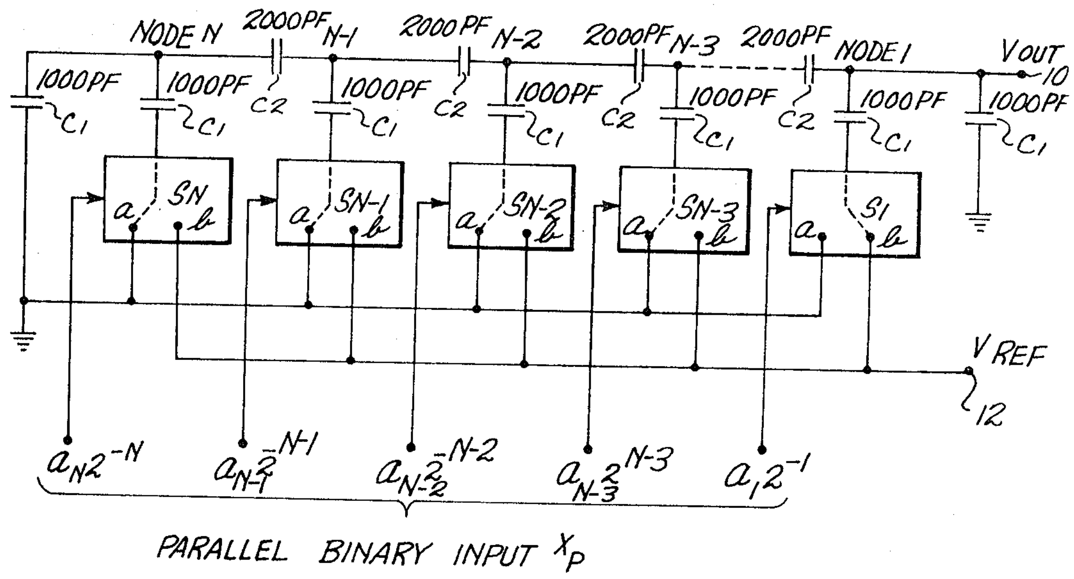
FIG. 2 is a schematic diagram of a d/a circuit illustrating an embodiment of this invention.

Turning now to FIG. 2, there is shown a parallel d/a converter that accepts a parallel-binary signal $X_p$ and has as many switches SN as there are bits in $X_p$. Each input line of $X_p$ operates one switch which connects the reference voltage $V_{REF}$ or ground to the capacitance network comprising the capacitors $C_1$ and $C_2$.

Parallel d/a converters are high speed signal processing systems since a D.C. output is provided as soon as the digital signal is applied to the input. Parasitics of the resistors in resistor ladder type d/a converters have been a contributing factor in limiting the response time of these d/a converters.

In contrast, the d/a converter of FIG. 2 utilizing a network of capacitors while limited in speed of operation at lower frequencies provides digital-analog conversion for high speed applications.

It should be noted that the parallel d/a converter requires the presence of input signals to provide the proper conversion and that most digital control circuits provide outputs only at specific time intervals, and that as a consequence it is necessary to provide buffer circuits (not shown) to store the digital input information signals to the d/a converter of FIG. 2 during the interim time periods. For parallel signals from digital control circuits, the buffer consists of *n* simple flip flop circuits, one for each bit in the parallel binary word and for serial signals from the digital control circuits, a set of *n* flip flop circuits are connected in a shift register in the manner known to those skilled in the d/a art.

As seen in FIG. 2, the switches SN, SN–1, SN–2, SN–3 through S1 are driven directly from the signals $$A_N 2^{-N}, A_{N-1}2^{-N-1}, A_{N-2}2^{-N-2}, A_{N-3}2^{N-3} \text{ through } A_1 2^{-1}$$

that represents the digital number $X_p$. These switches, one for each of the above bits in $X_p$ switch the corresponding capacitors $C_1$ serially connected to the respective nodes between a reference voltage source $V_{ref}$ connected to terminal 12 or ground depending upon the presence (ONE) or absence (ZERO) of the control signals $$A_N 2^{-N}, A_{N-1}2^{-N-1}, A_{N-2}2^{-N-2}, A_{N-3}2^{-N-3} \text{ through } A_1 2^{-1}$$

at the gating terminals of the respective switches SN, SN–1, SN–2, SN–3 through S1. The switches SN–1, SN–2, SN–3, through S1 may comprise switching means as shown in FIG. 2 functioning as single pole, double throw switches having the two positions *a*, and *b* depending upon the absence or presence of individual bits in the binary input control signal for actuating the switches. Typically the switches may comprise solid state devices such as Siliconix Corp. type 2N5432 transistors having $R_{DS} < 5$ ohms. Since the maximum speed of the d/a converter configuration of FIG. 2 is dependent upon capacitor charge up (or down) time which is proportional to the resistance-capacitance product of the network and the resistance comprises the $R_{DS}$ of the switch plus the lead inductances, the above switching type field effect transistor having low on resistance ($R_{DS}$) is selected. Other low $R_{DS}$ type switching devices may be utilized, however, and are preferable for the reasons given in the preceding.

Figure 1:
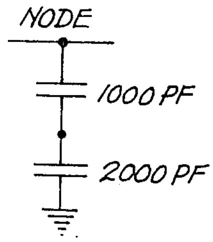
FIG. 1 is a schematic diagram illustrating the equivalent circuit at a node of the present d/a converter helpful in an understanding of converter operation.

The number of nodes N in the capacitor-ladder converter of FIG. 2 would be 12 in a 12-bit d/a converter and would require 12 switches, each switch coupling a capacitor $C_1$ to $V_{ref}$ or ground depending upon the presence or absence of an information bit at the control terminal of an individual switch. The voltage level $V_{out}$ at output terminal 10 of the d/a converter of FIG. 2 is a function of $V_{ref}$ itself and the number and positions of switches set to $V_{ref}$ or ground. At any node the equivalent circuit looks like the circuit of FIG. 1 so that the voltage at the node becomes ⅓ $V_{ref}$. If switch S1 of FIG. 2 is connecting the series capacitor $C_1$ between Node 1 and $V_{ref}$ (as shown symbolically) then $V_{out}$ becomes equal to ⅓ $V_{ref}$. If any further switch SN is set to couple series capacitor $C_1$ between Node N and $V_{ref}$ by the presence of bit $A_N 2^{-N}$ (ONE), then $V_{out}$ increases by ⅔ $V_{ref}/2^N$. The voltage $V_{out}$ at output terminal 10 is thus the sum of the contributions of the Node voltages developed by the information $$\text{bits } A_N 2^{-N}, A_{N-1}2^{-N-1}, A_{N-2}2^{-N-2}, A_{N-3}2^{-N-3}, \text{ and } A_1 2^{-1}$$

present at the individual input terminals of the converter. Between each conductive member or node N, N–1, N–2, N–3 and 1 there is connected a capacitor $C_2$. The first node 1 also forming the output terminal denoted 10 and last node N are also coupled to ground through a capacitor $C_2$.

While specific values are shown for the capacitors of the capacitor-ladder converter of FIG. 2, viz. $C_1$ = 1000 picofarads and $C_2$ = 2000 picofarads and the capacitance ratio is 2 to 1, it should be noted that the specific values and ratio shown while a common and useful ratio, as in the case of resistor ladder d/a converters, specific capacitor size may be varied but is a trade off involving in the case of capacitor d/a converters at least some of the following: larger value capacitors increase circuit size, decrease speed, cut thin film manufacturing yield, are more precise in value, while smaller value capacitors decrease size, increase speed and yield, but are less precise. While a $C_2 = 2C_1$ ratio type ladder is shown, another ratio of capacitors $C_1$ to $C_2$ along the ladder could be utilized as in resistor ladder networks.

A further consideration in a particular application of the capacitor ladder d/a converter of FIG. 2 is that $V_{ref}$ should be as high as possible for a given voltage switch so as to make errors caused by switch off situation or noise small compared with the full-scale voltage output, capacitor breakdown and other factors considered.

The capacitors of the capacitor ladder network shown are preferably thin film fabricated with present technology permitting capacitance ratios better than 0.1 percent without trimming or component selection, thus allowing the manufacture of high speed, low cost d/a or a/d converters in lieu of the more expensive resistor ladder converters.

It is to be understood that the above-described embodiment is illustrative of the applications of the principles of the invention, and other arrangements may be derived by those skilled in the art without departing from the spirit and scope of the invention.

What is claimed is:

1. A digital to analog converter comprising:
- a first predetermined reference potential;
- a second predetermined reference potential unequal to said first predetermined reference potential;
- a plurality of first capacitors having equal capacitance values;
- a plurality of second capacitors having equal capacitance values;
- N conductive members, the first and Nth one of said N conductive members each coupled through one of said first capacitors to said first predetermined reference potential;
- said first conductive member also providing the output terminal of said analog converter;
- one of said second capacitors coupled in series between each consecutive pair of said N conductive members;
- N switching means operable in response respectively to each of N information bits of a binary input signal for controlling the insertion respectively of individual ones of said first capacitors between respective ones of said N conductive members and said first reference potential or said second reference potential depending upon the information content of said binary input signal.

2. A digital to analog converter according to claim 1 wherein said first reference potential comprises ground potential.

3. A digital to analog converter according to claim 1 wherein said second capacitors have capacitance values greater than the capacitance values of said first capacitors.

4. A digital to analog converter according to claim 3 wherein the capacitance values of each of said second capacitors is equal to about twice the capacitance values of each of said first capacitors.

5. A digital to analog converter according to claim 4 wherein the capacitances of said second capacitors are equal to 2000 picofarads and the capacitances of said first capacitors are equal to 1000 picofarads.

6. A digital information signal processing circuit comprising:
- N input terminals for receiving N control signals;
- an output terminal;
- a plurality of first capacitors having equal capacitance values;
- a plurality of second capacitors having equal capacitance values greater than the capacitance values of said first capacitors;
- means for coupling said second capacitors in series between said output terminal and ground potential;
- N switching means responsive to said N control signals applied to said N input terminals for controlling the insertion of N of said first capacitors in circuit between said series coupled second capacitors and reference potential or ground potential depending upon the information content of said control signals.

7. A digital information signal processing circuit in accordance with claim 6 wherein said second capacitors have a capacitance value equal to twice the capacitance values of said first capacitors.

8. A digital to analog signal converter comprising:
- a ladder network of symmetrical T-section networks;
- each of said T-section networks having a first capacitor forming the base of said T-section network and second capacitors forming the arms of said T-section network;
- switching means responsive to a control signal for selectively coupling said first capacitor to ground or to a reference potential depending upon the amplitude level of said control signal.

9. A digital to analog converter according to claim 8 wherein said first capacitor has a capacitance value of about 1000 picofarads.

10. A digital to analog converter according to claim 8 wherein said switching means is arranged to couple said first capacitor to reference potential when said control signal level is representative of a logical ONE.

11. A digital to analog signal converter comprising:
- an output terminal;
- a plurality of capacitors having equal capacitance values;
- means for coupling said capacitors in series circuit between said output terminal and ground;
- a plurality of further capacitors having equal capacitance values;
- a plurality of switching means responsive to binary input signals having high and low voltage levels for selectively completing circuits including said further capacitors between said series circuit and ground or a reference potential.

* * * * *